US009392086B2

(12) United States Patent
Chu

(10) Patent No.: US 9,392,086 B2
(45) Date of Patent: Jul. 12, 2016

(54) ELECTRONIC APPARATUS

(71) Applicant: E Ink Holdings Inc., Hsinchu (TW)

(72) Inventor: Chun-Wei Chu, Hsinchu (TW)

(73) Assignee: E INK HOLDINGS INC., Hsinchu (TW)

(*) Notice: Subject to any disclaimer, the term of this patent is extended or adjusted under 35 U.S.C. 154(b) by 177 days.

(21) Appl. No.: 14/220,129

(22) Filed: Mar. 19, 2014

(65) Prior Publication Data

US 2015/0003025 A1 Jan. 1, 2015

(30) Foreign Application Priority Data

Jun. 26, 2013 (TW) .............................. 102122738 A

(51) Int. Cl.
*H05K 1/00* (2006.01)
*H04M 1/02* (2006.01)
*H05K 1/14* (2006.01)

(52) U.S. Cl.
CPC ............. *H04M 1/0277* (2013.01); *H05K 1/144* (2013.01); *H05K 2201/042* (2013.01); *H05K 2201/2018* (2013.01)

(58) Field of Classification Search
CPC ..... H02G 11/00; H04M 1/0277; H05K 1/144; H05K 2201/042; H05K 2201/2018
USPC ......... 361/790, 749, 803, 804, 733, 735, 760, 361/764; 439/69, 76.1, 91
See application file for complete search history.

(56) References Cited

U.S. PATENT DOCUMENTS

| 3,648,113 A | 3/1972 | Rathjen et al. |
| 5,495,389 A | 2/1996 | Dewitt et al. |
| 5,677,569 A * | 10/1997 | Choi ................ H01L 25/0657 257/686 |
| 5,835,988 A * | 11/1998 | Ishii .................. H01L 23/3107 257/666 |
| 5,841,638 A * | 11/1998 | Purdom ................ H05K 1/144 206/305 |
| 7,126,829 B1 * | 10/2006 | Yen ..................... H01L 25/105 257/686 |
| 7,957,550 B2 | 6/2011 | Jih-Fon et al. |
| 2001/0006829 A1 * | 7/2001 | Moden ............... H01L 25/105 438/109 |
| 2006/0066770 A1 | 3/2006 | Hayano et al. |
| 2011/0037919 A1 * | 2/2011 | Lin .................. G02F 1/133308 349/58 |
| 2011/0059630 A1 * | 3/2011 | Tanaka ................ H05K 1/144 439/65 |
| 2011/0187692 A1 | 8/2011 | Jung |

FOREIGN PATENT DOCUMENTS

| JP | 2002033590 A | 1/2002 |
| TW | M424624 | 3/2012 |

OTHER PUBLICATIONS

Corresponding Taiwanese Office Action that these art references were cited.

* cited by examiner

*Primary Examiner* — Yuriy Semenenko
(74) *Attorney, Agent, or Firm* — CKC & Partners Co., Ltd.

(57) ABSTRACT

An electronic apparatus includes a frame, a plurality of flexible circuit boards, and a plurality of hardware devices. The frame includes a first frame body and a second frame body. The first frame body and the second frame body are spaced apart from each other, and define an accommodation space therebetween. The flexible circuit boards are accommodated in the accommodation space. Each flexible circuit board includes a first edge and a second edge opposite to the first edge. The first edge is connected to the first frame body. The second edge is connected to the second frame body. The hardware devices are disposed on the corresponding flexible circuit boards.

10 Claims, 7 Drawing Sheets

US 9,392,086 B2

ELECTRONIC APPARATUS

RELATED APPLICATIONS

This application claims priority to Taiwanese Application Serial Number 102122738, filed Jun. 26, 2013, which is herein incorporated by reference.

BACKGROUND

1. Technical Field

Embodiments of the present invention relate n electronic apparatus.

2. Description of Related Art

A small-display electronic apparatus, such as a watch, a cell phone, a GPS device etc., applies rigid circuit boards like PCBs. The manufacturer of the electronic apparatus mounts hardware devices, e.g. a processor, a power supply and a memory, onto the rigid circuit boards.

The hardware devices may be disposed on a multi-layer circuit board, which is formed by multiple closely-laminated circuit boards. The multi-layer circuit board is popular because the circuit layout can be formed on each surface of the circuit boards which significantly increases the total layout area.

However, in that the each circuit board includes a certain thickness and weight, the multi-layer circuit board having plural circuit boards (such as four, five, six, seven or eight circuit boards) may become very thick and heavy, which is adverse to the compact and lightweight design of the electronic apparatus.

SUMMARY

A summary of various embodiments according to the present invention is disclosed below. it should be understood that these aspects are presented merely to provide the reader with a brief summary of these certain embodiments and that these aspects are not intended to limit the scope of this disclosure.

The present invention provides an electronic apparatus that is thinner and lighter than the typical electronic apparatus having multi-layer circuit boards.

In accordance with one embodiment of the present invention, the electronic apparatus includes a frame, a plurality of flexible circuit boards, and a plurality of hardware devices. The frame includes a first frame body and a second frame body. The first frame body and the second frame body are spaced apart from each other, and define an accommodation space therebetween. The flexible circuit boards are accommodated in the accommodation space. Each flexible circuit board includes a first edge and a second edge opposite to the first edge. The first edge is connected to the first frame body. The second edge is connected to the second frame body. The hardware devices are disposed on the corresponding flexible circuit boards.

In the foregoing embodiment, the hardware devices are respectively disposed on the flexible circuit boards, and because the flexible circuit board is thinner and lighter than the typical rigid circuit board, such as the PCB, the electronic apparatus can be thinner and lighter.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiment, with reference made to the accompanying drawings as follows.

DETAILED DESCRIPTION

Figure 1:
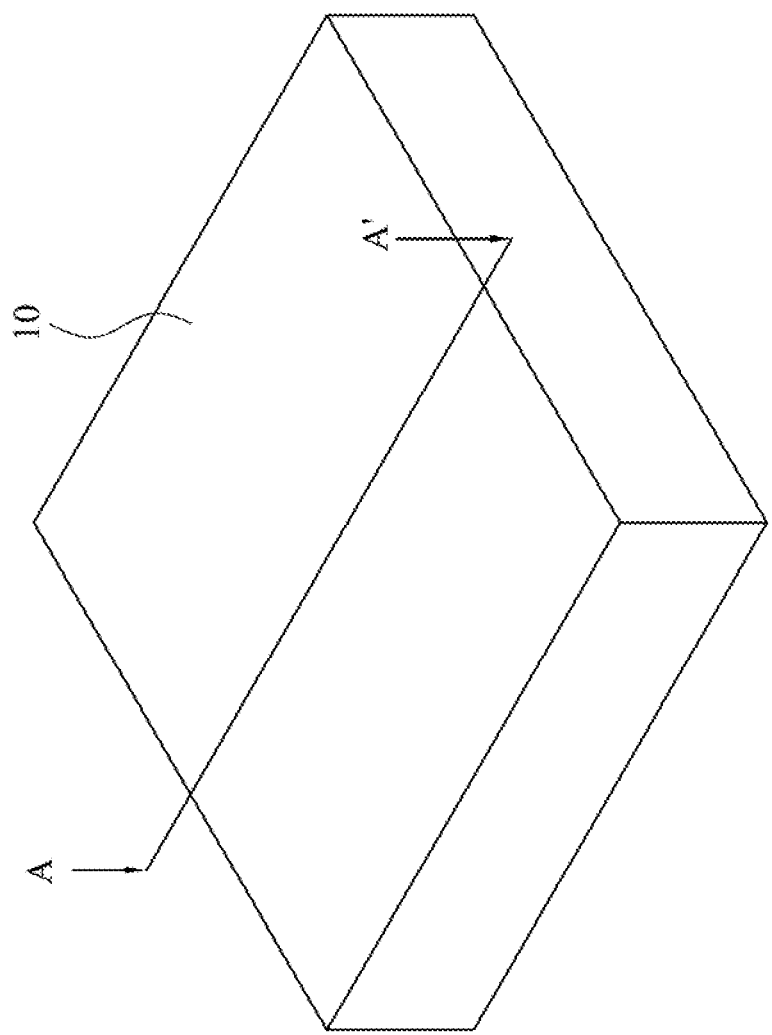
FIG. 1 is a perspective view of an electronic apparatus in accordance with the first embodiment of the present invention.

Reference will now be made in detail to the present embodiments of the invention, examples of which are illustrated in the accompanying drawings. Wherever possible, the same reference numbers are used in the drawings and the description to refer to the same or like parts.

Embodiment 1

Figure 2:
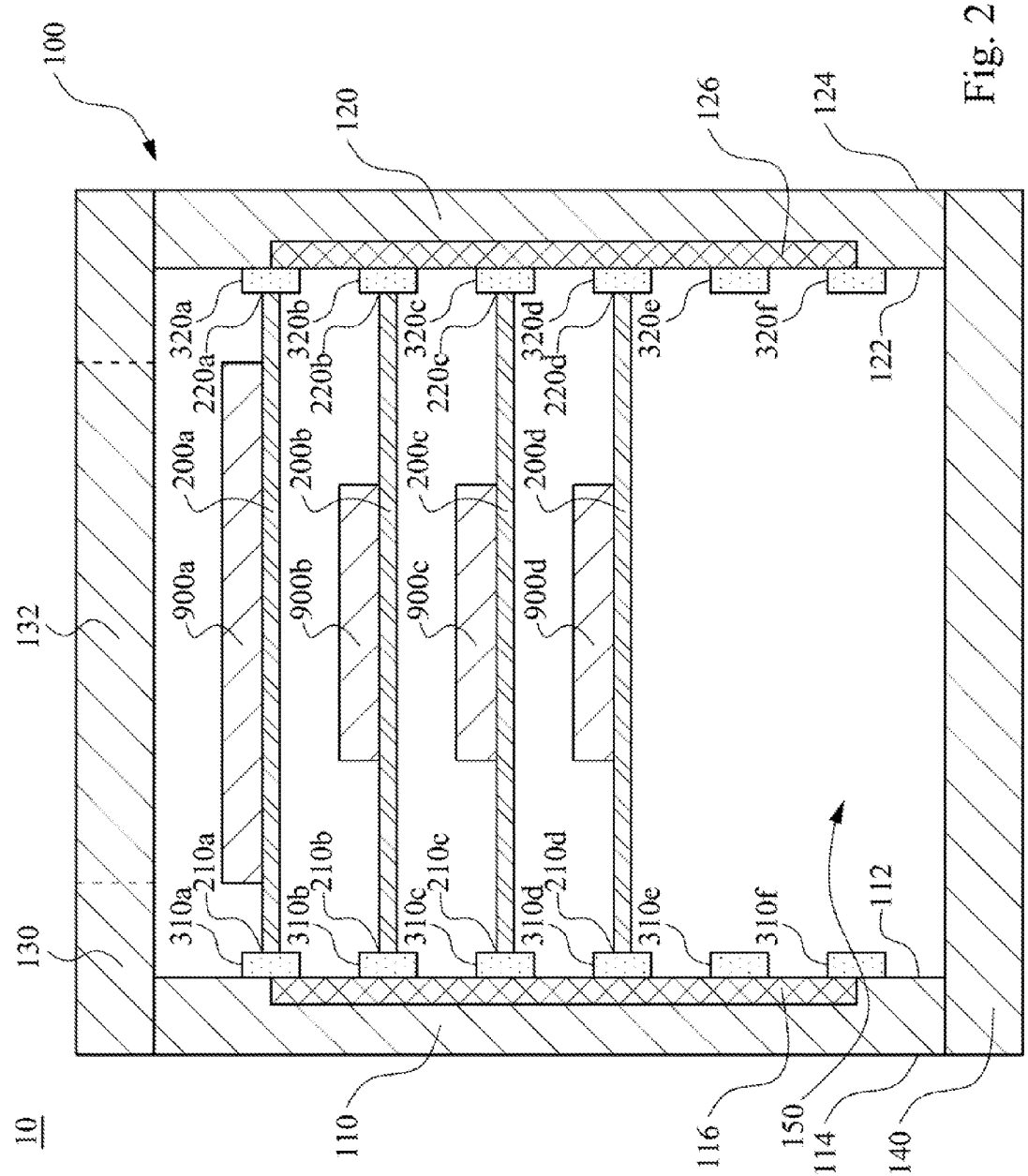
FIG. 2 is a cross-sectional view of the electronic apparatus taken along A-A' line in FIG. 1.

FIG. 1 is a perspective view of an electronic apparatus 10 in accordance with the first embodiment of the present invention. FIG. 2 is a cross-sectional view of the electronic apparatus 10 taken along A-A' line in FIG. 1. As shown in FIG. 2, the electronic apparatus 10 includes a frame 100, a plurality of flexible circuit boards 200a, 200b, 200c and 200d, and a plurality of hardware devices 900a, 900b 900c and 900d. The frame 100 includes a first frame body 110, a second frame body 120, a cover 130 and a base 140. The first frame body 110 and the second frame body 120 are disposed on the same surface of the base 140. The first frame body 110 and the second frame body 120 are spaced apart from each other, and define an accommodation space 150 therebetween. The cover 130 is positioned across the first frame body 110 and the second frame body 120, so as to seal the accommodation space 150. The boundary among the first frame body 110, the second frame body 120, the cover 130 and the base 140 are preferably waterproof, so as to prevent the water from getting into the accommodation space 150.

The flexible circuit boards 200a, 200b, 200c and 200d are accommodated in the accommodation space 150. The flexible circuit board 200a includes a first edge 210a and a second edge 220'a opposite to the first edge 210a. The flexible circuit board 200b includes a first edge 210b and a second edge 220b opposite to the first edge 210b. The flexible circuit board 200c includes a first edge 210c and a second edge 220c opposite to the first edge 210c. The flexible circuit board 200d includes a first edge 210d and a second edge 220d opposite to the first edge 210d. The first edges 210a, 210b, 210c and 210d are connected to the first frame body 110. The second edges 220a, 220b, 220c and 220d are connected to the second frame body 120. In other words, the flexible circuit boards 200a, 200b, 200c and 200d are all connected between the first frame body 110 and the second frame body 120. Because the flexible circuit boards 200a, 200b, 200c and 200d are spaced apart from each other, the hardware device 900a can be disposed on the flexible circuit board 200a; the hardware device 900b can be disposed on the flexible circuit board 200b; the hardware device 900c can be disposed on the flexible circuit board 200c; and the hardware device 900d can be disposed on the flexible circuit board 200d.

Because the flexible circuit boards 200a, 200b, 200c and 200d are thinner and lighter than the typical PCB, the electronic apparatus 10 can be thinner and lighter.

In this embodiment, the first frame body 110 includes a first wire 116 therein. The flexible circuit boards 200a, 200b, 200c and 200d are all electrically connected to the first wire 116. In detail, the first frame body 110 includes a first inner surface 112 and a first outer surface 114. The first inner surface 112 faces toward the second frame body 120, and the first outer surface 114 is opposite to the second frame body 120. The first wire 116 can be positioned between the first inner surface 112 and the first outer surface 114. The electronic apparatus 10 includes a plurality of first connectors 310a, 310b, 310c and 310d. The first connectors 310a, 310b, 310c and 310d are disposed on the first inner surface 112 of the first frame body 110 and electrically connected to the first wire 116. The first edge 210a of the flexible circuit board 200a is plugged in the first connector 310a, so that the first connector 310a can secure the first edge 210a, and the conductive pattern or the wire (not shown) on the first edge 210a can be electrically connected to the first wire 116 via the first connector 310a. The first edge 210b of the flexible circuit hoard 200b is plugged in the first connector 310b, so that the first connector 310b can secure the first edge 210b, and the conductive pattern or the wire (not shown) on the first edge 210b can be electrically connected to the first wire 116 via the first connector 310b. The first edge 210c of the flexible circuit board 200c is plugged in the first connector 310c, so that the first connector 310c can secure the first edge 210c, and the conductive pattern or the wire (not shown) on the first edge 210c can be electrically connected to the first wire 116 via the first connector 310c. The first edge 210d of the flexible circuit board 200d is plugged in the first connector 310d, so that the first connector 310d can secure the first edge 210d, and the conductive pattern or the wire (not shown) on the first edge 210d can be electrically connected to the first wire 116 via the first connector 310d.

In other words, the flexible circuit boards 200a, 200b, 200c, and 200d can be electrically connected to the first wire 116 via the first connector 310a, 310b, 310c and 310d, so that the hardware devices 900a, 900b, 900c and 900d can be electrically connected to each other and can transfer the signals to each) other.

For example, the hardware device 900a can be, but is not limited to be, a display device, such as an LCD (liquid crystal display) or an EPD (electro-phoretic display). The hardware device 900b can be, but is not limited to be, a wireless transmission module, such as a bluetooth module and a Wifi module. The hardware device 900c can be a processor. The hardware device 900d can be a power source. The display device, the wireless transmission device, the processor and the power source can be electrically connected to each other via the first wire 116. As such, the power source can provide electric power to the display device, the wireless transmission device and the processor. When the wireless transmission module receives a wireless signal from an external device (not shown), it can transmit the wireless signal to the processor. The processor can control the display device to show corresponding images based on the wireless signal.

In this embodiment, the second frame body 120 includes a second wire 126 therein. In addition to the first wire 116, the flexible circuit boards 200a, 200b, 200c, and 200d can also be electrically connected to the second wire 126. In other words, the flexible circuit boards 200a, 200b, 200c, and 200d can electrically connected between the first wire 116 within the first frame body 110 and the second wire 126 within the second frame body 120.

In detail, the second frame body 120 includes a second inner surface 12 and a second outer surface 124. The second inner surface 122 faces toward the first frame body 110, and the second outer surface 124 is opposite to the first frame body 110. The second wire 126 can be positioned between the second inner surface 122 and the second outer surface 124. The electronic apparatus 10 includes a plurality of second connectors 320a, 320b, 320c and 320d. The second connectors 320a, 320b, 320c and 320d are disposed on the second inner surface 122 of the second frame body 120 and electrically connected to the second wire 126. The second edge 220a of the flexible circuit board 200a is plugged in the second connector 320a, so that the second connector 320a can secure the second edge 220a, and the conductive pattern or the wire (not shown) on the second edge 220a can be electrically connected to the second wire 126 via the second connector 320a. The second edge 220b of the flexible circuit board 200b is plugged in the second connector 320b, so that the second connector 320b can secure the second edge 220b, and the conductive pattern or the wire (not shown) on the second edge 220b can be electrically connected to the second wire 126 via the second connector 320b. The second edge 220c of the flexible circuit board 200c is plugged in the second connector 320c, so that the second connector 320c can secure the second edge 220c, and the conductive pattern or the wire (not shown) on the second edge 220c can be electrically connected to the second wire 126 via the second connector 320c. The second edge 220d of the flexible circuit board 200d is plugged in the second connector 320d, so that the second connector 320d can secure the second edge 220d, and the conductive pattern or the wire (not shown) on the second edge 220d can be electrically connected to the second wire 126 via the second connector 320d.

In other words, the flexible circuit boards 200a, 200b, 200c, and 200d can be electrically connected to the first wire 126 via the second connector 320a, 320b, 320c and 320d, so that the hardware devices 900a, 900b, 900c and 900d can be electrically connected to each other via the first wire 116 and the second wire 126.

In this embodiment, when the flexible circuit board 200a is not bended, the distance between the first edge 210a and the second edge 220a approximately equals to the distance between the first connector 310a and the second connector 320a. Therefore, when the first edge 210a is plugged in the first connector 310a, and the second edge 310b is plugged in the second connector 320a, the flexible circuit board 200a can be tensioned, instead of drooping due to the weight of the hardware device 900a.

Similarly, when the flexible circuit board 200b is not bended, the distance between the first edge 210b and the second edge 220b approximately equals to the distance between the first connector 310b and the second connector 320b. When the flexible circuit board 200c is not bended, the distance between the first edge 210c and the second edge 220c approximately equals to the distance between the first connector 310c and the second connector 320c. Therefore, the flexible circuit boards 200b, 200c and 200d can also be tensioned, not drooping.

In this embodiment, the electronic apparatus 10 includes first connectors 310e, 310f, and second connectors 320e and 320f. The first connector 310e is aligned with the second connector 320e, and the first connector 310f is aligned with the second connector 320f. As such, the user can plug additional flexible circuit boards depending on the demand. In contrary, the user can also remove the flexible circuit board 200a, 200b, 200c or 200d depending on the demand. In other words, the user can replace the flexible circuit boards and the hardware devices thereon, so the electronic apparatus 10 can be widely applied on various products, such as the watch or the cell phone.

In this embodiment, the cover 130 has a light-transmissive area 132. The projection position of the light-transmissive area 132 on the flexible circuit board 200a overlaps with the hardware device 900a. in other words, the light-transmissive area 132 is positioned exactly above the hardware device 900a. Therefore, when the hardware device 900a is the display device, the user can see the image shown on the display device through the light-transmissive area 132.

In this embodiment, the flexible circuit boards 200a, 200b, 200c and 200d can be, but is not limited to be, an FPC (flexible printed circuit).

Second Embodiment

Figure 3:
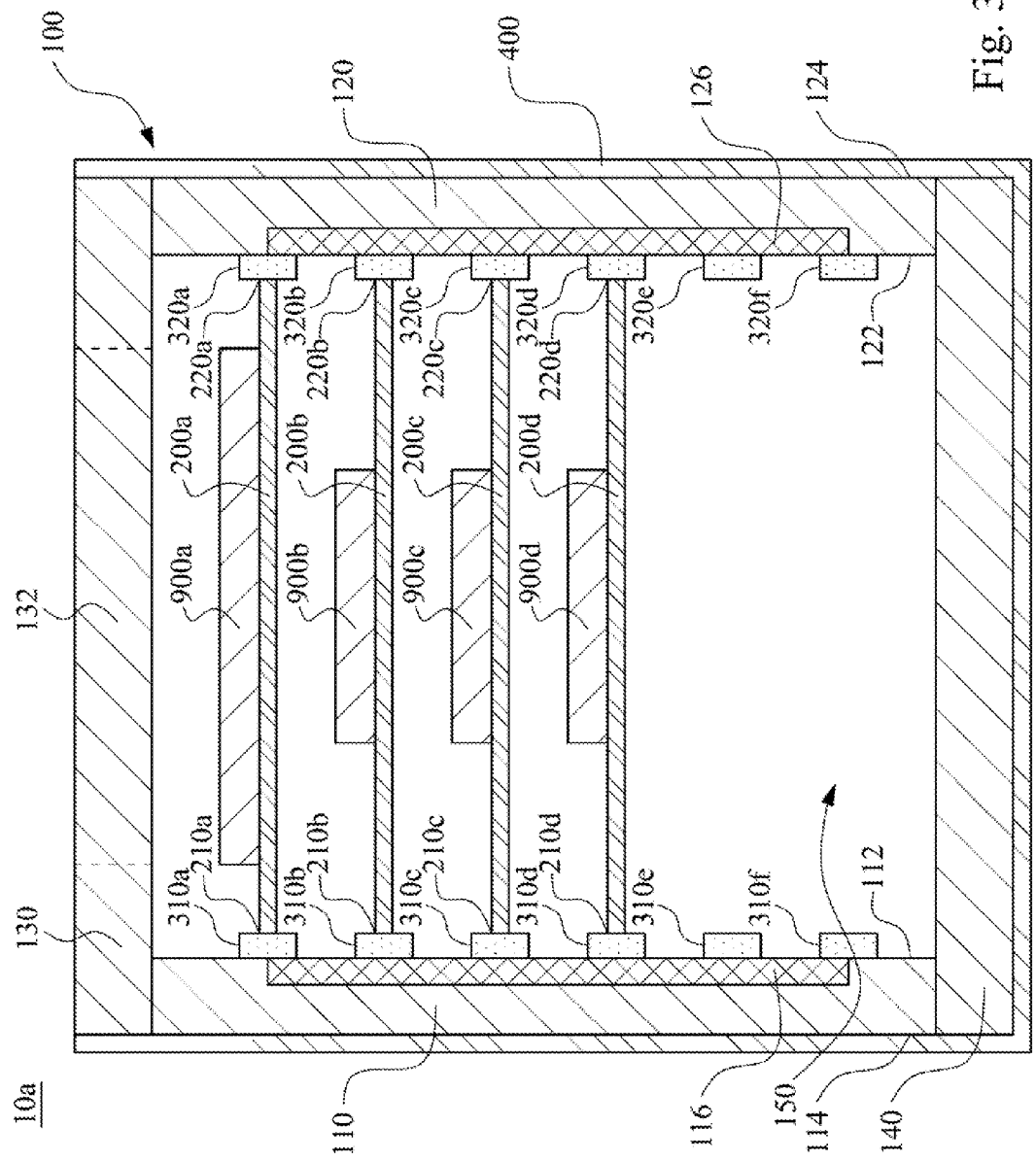
FIG. 3 is a cross-sectional view of the electronic apparatus in accordance with the second embodiment of the present invention.

FIG. 3 is a cross-sectional view of the electronic apparatus 10a in accordance with the second embodiment of the present invention. As shown in FIG. 3, the main difference between this embodiment and FIG. 2 is that: the electronic apparatus 10a includes an antistatic layer 400. The antistatic layer 400 is disposed on the frame 100. For example, the antistatic layer 400 can be the metal coating layer at least covering the first outer surface 114 of the first frame body 110 and the second outer surface 124 of the second frame body 120, so as to prevent the flexible circuit boards 200a, 200b, 200c, 200d and the hardware devices 900a, 900b, 900c and 900d from affected by the static electricity.

Other features and the relations therebetween are the same as described in the first embodiment, and will not be described repeatedly.

Third Embodiment

Figure 4:
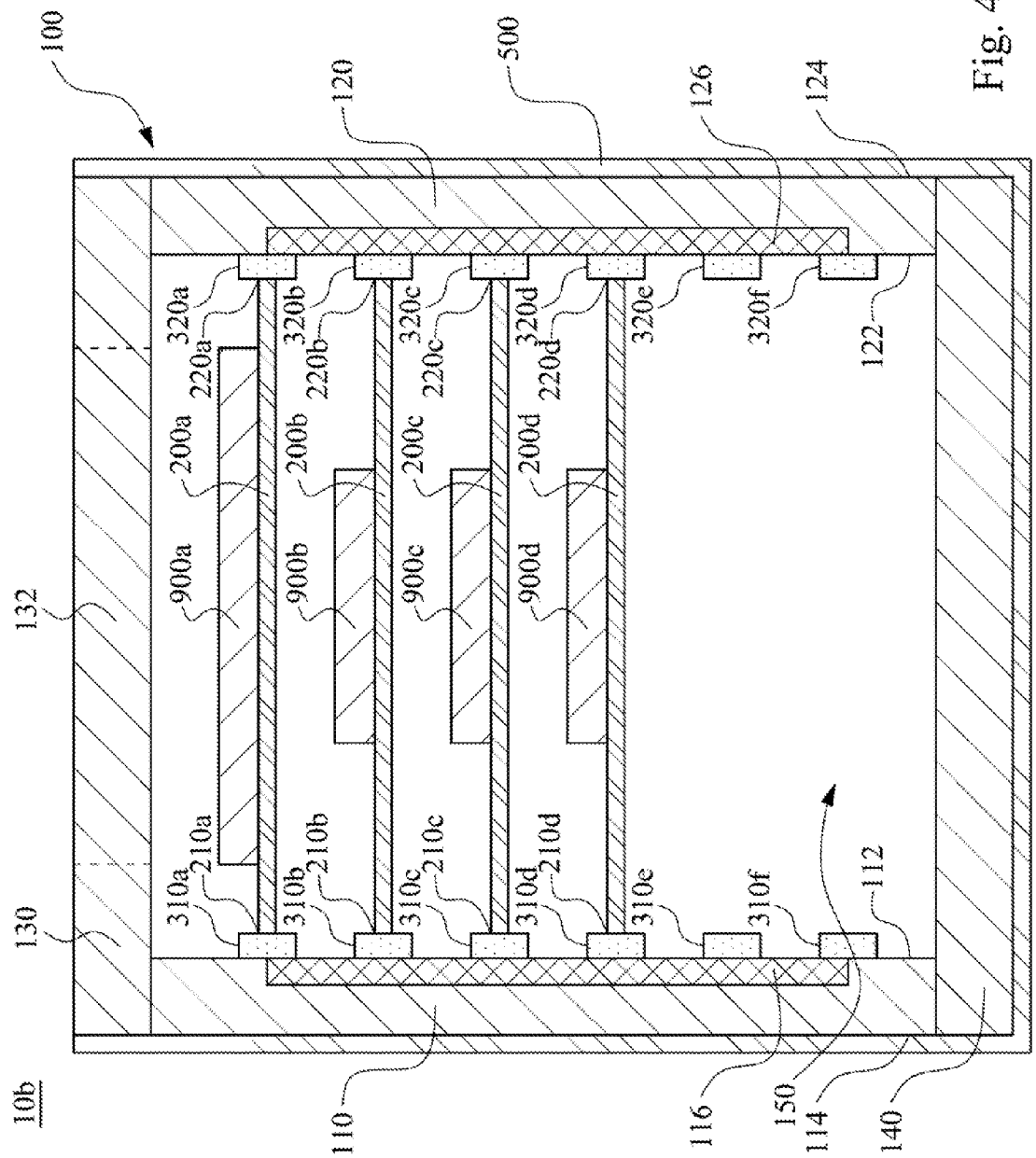
FIG. 4 is a cross-sectional view of the electronic apparatus in accordance with the third embodiment of the present invention.

FIG. 4 is a cross-sectional view of the electronic apparatus 10b in accordance with the third embodiment of the present invention. As shown in FIG. 4, the main difference between this embodiment and FIG. 2 is that: the electronic apparatus 10b includes a waterproof layer 500. The waterproof layer 500 is disposed on the frame 100. For example, the waterproof layer 500 can be the PTFE (polytetrafluoroethene) at least covering the first outer surface 114 of the first frame body 110 and the second outer surface 124 of the second frame body 120, so as to prevent the flexible circuit boards 200a, 200b, 200c, 200d and the hardware devices 900a, 900b, 900c and 900d from affected by the water.

Other features and the relations therebetween are the same as described in the first embodiment, and will not be described repeatedly.

Fourth Embodiment

Figure 5:
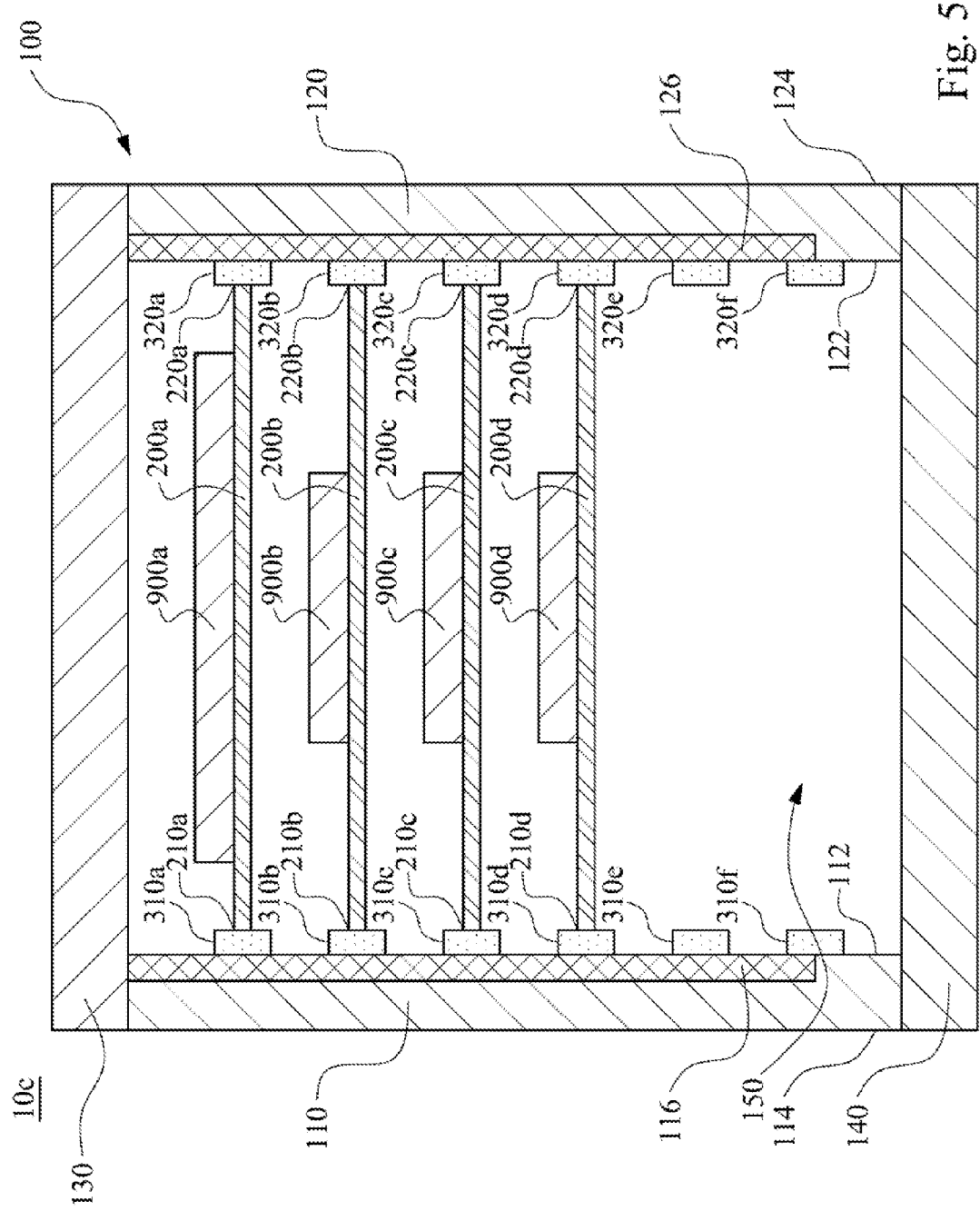
FIG. 5 is a cross-sectional view of the electronic apparatus in accordance with the fourth embodiment of the present invention.

FIG. 5 is a cross-sectional view of the electronic apparatus 10c in accordance with the fourth embodiment of the present invention. As shown in FIG. 5, the main difference between this embodiment and FIG. 2 is that: the cover 130 of the electronic apparatus 10c of this embodiment is a touch panel. The first wire 116 and the second wire 126 can be electrically connected to the touch panel. Therefore, the user can touch the cover 130 (touch panel) to operate the electronic apparatus 10c.

Other features and the relations therebetween are the same as described in the first embodiment, and will not be described repeatedly.

Fifth Embodiment

Figure 6:
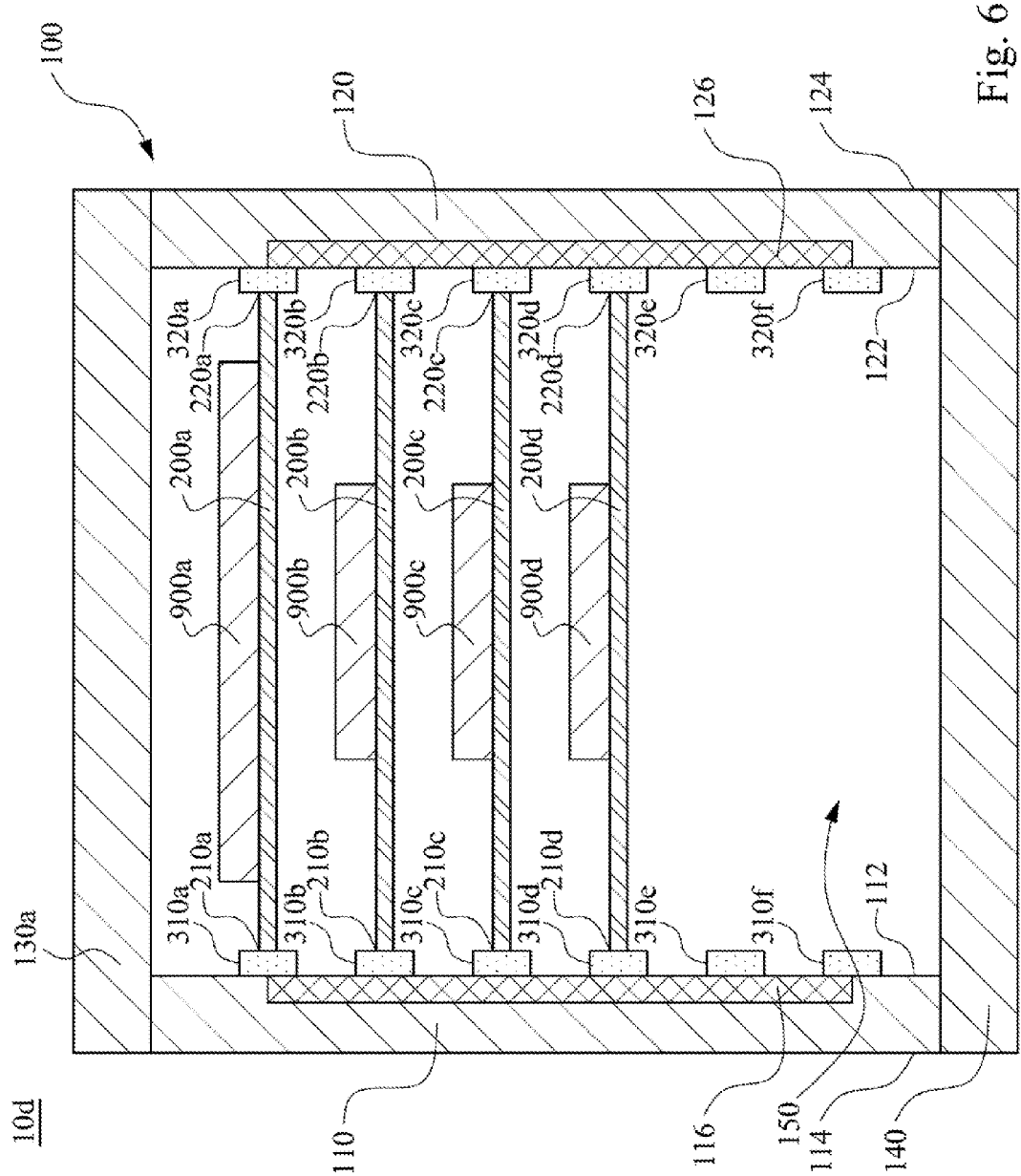
FIG. 6 is a cross-sectional view of the electronic apparatus in accordance with the fifth embodiment of the present invention.

FIG. 6 is a cross-sectional view of the electronic apparatus 10d in accordance with the fifth embodiment of the present invention. As shown in FIG. 6, the main difference between this embodiment and FIG. 2 is that: the cover 130a doesn't include the light-transmissive area 132 (See FIG. 2). In other words, the entire area of the cover 130a is opaque.

Other features and the relations therebetween are the same as described in the first embodiment, and will not be described repeatedly.

Sixth Embodiment

Figure 7:
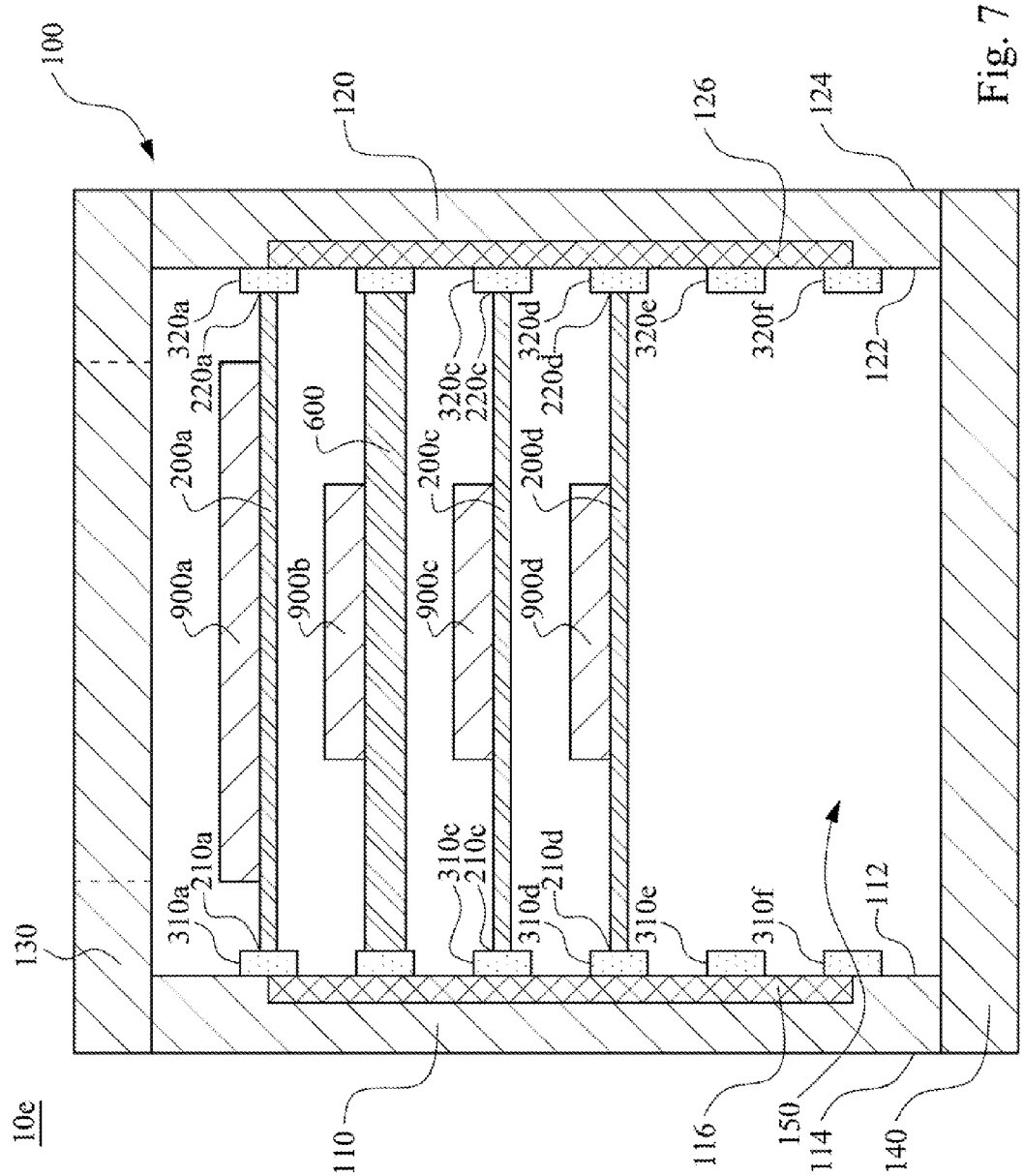
FIG. 7 is a cross-sectional view of the electronic apparatus 10e in accordance with the sixth embodiment of the present invention.

FIG. 7 is a cross-sectional view of the electronic apparatus 10e in accordance with the sixth embodiment of the present invention. As shown in FIG. 7, the main difference between this embodiment and FIG. 2 is that the electronic apparatus 10e includes at least one rigid circuit board 600. The rigid circuit board 600 is accommodated in the accommodation space 150. The flexural strength of the flexible circuit boards 200a, 200c and 200d is greater than the flexural strength of the rigid circuit board 600. In other words, the rigid circuit board 600 cannot be bended. Therefore, the rigid circuit board 600 can improve the structural strength of the frame 100, thereby keeping the flexible circuit boards 200a, 200c and 200d tensioned, and preventing them from drooping.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. An electronic apparatus comprising:
   a frame comprising a first frame body and a second frame body, wherein the first frame body and the second frame body are spaced apart from each other, and define an accommodation space therebetween, wherein the first frame body comprises a first wire therein;
   plurality of flexible circuit boards accommodated in the accommodation space, wherein each of the flexible circuit boards comprises a first edge and a second edge opposite to the first edge, the first edges are connected to the first frame body, and the second edges are connected to the second frame body, wherein the flexible circuit boards are all electrically connected to the first wire;
   a plurality of hardware devices respectively disposed on the corresponding flexible circuit boards; and
   a plurality of first connectors, wherein the first frame body comprises a first inner surface facing toward the second frame body, and the first connectors are disposed on the first inner surface and electrically connected to the first wire, and the first edges of the flexible circuit boards are respectively plugged in the corresponding first connectors.

2. The electronic apparatus of claim 1, wherein the second frame body comprises a second wire therein, and the flexible circuit boards are electrically connected between the first wire and the second wire.

3. The electronic apparatus of claim 2, further comprising:
a plurality of second connectors, wherein the second frame body comprises a second inner surface facing toward the first frame body, and the second connectors are disposed on the second inner surface and electrically connected to the second wire, and the second edges of the flexible circuit boards are respectively plugged in the corresponding second connectors.

4. The electronic apparatus of claim 1, further comprising:
an antistatic layer disposed on the frame.

5. The electronic apparatus of claim 1, further comprising:
a waterproof layer disposed on the frame.

6. The electronic apparatus of claim 1, further comprising:
at least one rigid circuit board accommodated in the accommodation space, wherein the flexural strength of the flexible circuit board is greater than the flexural strength of the rigid circuit board, and the rigid circuit board is connected between the first frame body and the second frame body.

7. The electronic apparatus of claim 1, wherein the frame comprises a cover positioned across the first frame body and the second frame body.

8. The electronic apparatus of claim 7, wherein the cover has a light-transmissive area, and a projection position of the light-transmissive area on one of the flexible circuit boards overlaps with one of the hardware devices.

9. The electronic apparatus of claim 8, wherein one of the hardware devices is a display panel, and the display panel is exposed to the light-transmissive area.

10. The electronic apparatus of claim 1, wherein the flexible circuit boards are spaced apart from each other.

* * * * *